US012660448B2

(12) United States Patent
Seo et al.

(10) Patent No.: US 12,660,448 B2
(45) Date of Patent: Jun. 16, 2026

(54) DISPLAY DEVICE

(71) Applicant: Samsung Display Co., Ltd., Yongin-si (KR)

(72) Inventors: Dongrock Seo, Yongin-si (KR); Guanghai Jin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 397 days.

(21) Appl. No.: 18/504,322

(22) Filed: Nov. 8, 2023

(65) Prior Publication Data

US 2024/0324343 A1 Sep. 26, 2024

(30) Foreign Application Priority Data

Mar. 24, 2023 (KR) ........................ 10-2023-0039039
Jun. 15, 2023 (KR) ........................ 10-2023-0077063

(51) Int. Cl.
H10K 59/131 (2023.01)
H10K 59/121 (2023.01)

(52) U.S. Cl.
CPC ....... H10K 59/131 (2023.02); H10K 59/1213 (2023.02)

(58) Field of Classification Search
CPC ........................ H10K 59/131; H10K 59/1213
See application file for complete search history.

(56) References Cited

U.S. PATENT DOCUMENTS

| | | | |
|---|---|---|---|
| 9,711,538 B2 | 7/2017 | Jeong | |
| 10,170,052 B2 | 1/2019 | Nam et al. | |
| 11,257,897 B2 * | 2/2022 | Cha | H10K 59/131 |
| 11,502,158 B2 * | 11/2022 | Oh | H10K 59/87 |
| 11,711,953 B2 * | 7/2023 | Bok | G09G 3/3266 |
| | | | 257/79 |
| 12,408,433 B2 * | 9/2025 | Park | H10D 89/931 |
| 2019/0237533 A1 * | 8/2019 | Kim | H10K 59/126 |
| 2021/0098550 A1 * | 4/2021 | Moon | H10K 59/131 |
| 2021/0335986 A1 * | 10/2021 | Jeon | H10K 59/131 |
| 2024/0324343 A1 * | 9/2024 | Seo | H10K 59/1213 |
| 2024/0346984 A1 * | 10/2024 | Yoon | G09G 3/32 |

FOREIGN PATENT DOCUMENTS

| | | |
|---|---|---|
| KR | 100814877 B1 | 3/2008 |
| KR | 102385454 B1 | 4/2022 |
| KR | 102392889 B1 | 5/2022 |
| KR | 102445816 B1 | 9/2022 |

* cited by examiner

*Primary Examiner* — Bac H Au
(74) *Attorney, Agent, or Firm* — CANTOR COLBURN LLP

(57) ABSTRACT

A display device including a substrate including a display area and a peripheral area outside the display area, a circuit driver arranged in a central portion of the display area and extending in a first direction, and a first signal line connected to the circuit driver and extending at one side in a second direction crossing the first direction, wherein the first signal line has a first width in the first direction, and the first width decreases constantly from the circuit driver toward the peripheral area.

20 Claims, 5 Drawing Sheets

DISPLAY DEVICE

This application claims priority to Korean Patent Application No. 10-2023-0039039, filed on Mar. 24, 2023, and Korean Patent Application No. 10-2023-0077063, filed on Jun. 15, 2023, and all the benefits accruing therefrom under 35 U.S.C. § 119, the contents of which in their entirety are herein by reference.

BACKGROUND

1. Field

The present disclosure relates to a display device, and more particularly to a display device having an improved reliability and resolution.

2. Description of the Related Art

Display devices visually display data. Display devices may provide images by using light-emitting diodes. The usage of display devices has diversified, and various attempts have been made to develop designs to improve the quality of display devices.

SUMMARY

One or more embodiments include a display device with improved reliability and resolution.

According to one or more embodiments, a display device includes a substrate including a display area and a peripheral area outside the display area, a circuit driver arranged in a central portion of the display area and extending in a first direction, and a first signal line connected to the circuit driver and extending on one side in a second direction crossing the first direction, wherein the first signal line has a first width in the first direction, and the first width decreases consistently from the circuit driver toward the peripheral area.

In an embodiment, the display device may further include a first initialization voltage driver arranged on one side of the peripheral area and extending in the first direction, and a first initialization voltage line connected to the first initialization voltage driver and extending in the second direction, wherein the first initialization voltage line may have a second width in the first direction, and the second width may decrease consistently from the first initialization voltage driver toward the circuit driver.

In an embodiment, the first width of the first signal line may increase consistently from the peripheral area toward the circuit driver.

In an embodiment, the second width of the first initialization voltage line may increase consistently from the circuit driver toward the first initialization voltage driver.

In an embodiment, when the display device is viewed in a direction perpendicular to the substrate, a sum of the first width of the first signal line and the second width of the first initialization voltage line may be constant at any point of the substrate in the second direction.

In an embodiment, the display device may further include a wiring portion including the first signal line and the first initialization voltage line.

In an embodiment, a plurality of the wiring portion may be arranged apart from each other at regular intervals in the first direction.

In an embodiment, the display device may further include a second signal line connected to the circuit driver and extending on the other side in the second direction, wherein the second signal line may have a third width in the first direction, wherein the third width may decrease consistently from the circuit driver toward the peripheral area.

In an embodiment, the display device may further include a second initialization voltage driver arranged on the other side of the peripheral area and extending in the first direction, and a second initialization voltage line connected to the second initialization voltage driver and extending in the second direction, wherein the second initialization voltage line may have a fourth width in the first direction, wherein the fourth width may decrease consistently from the second initialization voltage driver toward the circuit driver.

In an embodiment, the third width of the second signal line may increase consistently from the peripheral area toward the circuit driver.

In an embodiment, the fourth width of the second initialization voltage line may increase consistently from the circuit driver toward the second initialization voltage driver.

In an embodiment, when the display device is viewed in a direction perpendicular to the substrate, a sum of the third width of the second signal line and the fourth width of the second initialization voltage line may be constant at any point of the substrate in the second direction.

In an embodiment, the display device may further include a first organic light-emitting diode disposed above the circuit driver, and a first subpixel circuit electrically connected to the first organic light-emitting diode and arranged adjacent to the circuit driver in the display area.

In an embodiment, the first subpixel circuit may include a first semiconductor layer and a first thin-film transistor insulated from the first semiconductor layer.

In an embodiment, the first organic light-emitting diode may include a subpixel electrode disposed on the substrate, an emission layer disposed on the subpixel electrode, and a counter electrode disposed on the emission layer.

In an embodiment, the first subpixel circuit may be electrically connected to the first signal line.

In an embodiment, the first subpixel circuit may be electrically connected to the first initialization voltage line.

According to one or more embodiments, a display device includes a substrate including a display area and a peripheral area outside the display area, a circuit driver arranged in a central portion of the display area and extending in a first direction, a first initialization voltage driver arranged in the peripheral area and extending in the first direction, a first signal line connected to the circuit driver, extending in a second direction crossing the first direction, and having a first width in the first direction, and a first initialization voltage line connected to the first initialization voltage driver, extending in the second direction, and having a second width in the first direction, wherein, when the display device is viewed in a direction perpendicular to the substrate, a sum of the first width and the second width is constant at any point of the substrate in the second direction.

In an embodiment, the first width of the first signal line may decrease consistently from the circuit driver toward the peripheral area.

In an embodiment, the second width of the first initialization voltage line may decrease consistently from the first initialization voltage driver toward the circuit driver.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
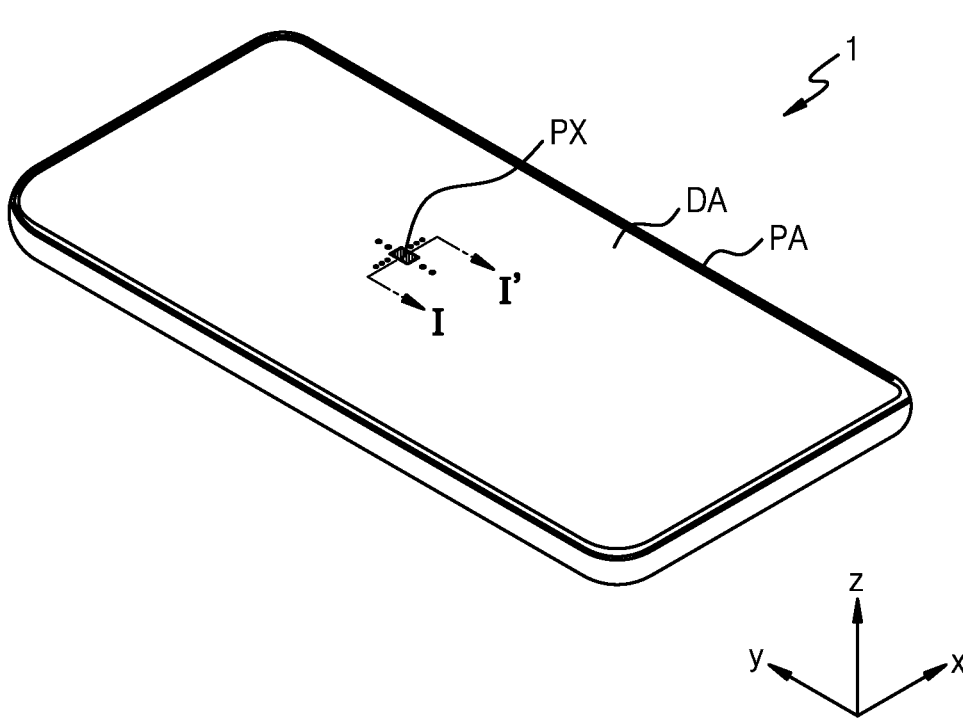
FIG. 1 is a perspective view of a display device, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the invention. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the embodiments, and methods for achieving them will be clarified with reference to embodiments described below in detail with reference to the drawings. However, the invention is not limited to the following embodiments and may be embodied in various forms.

Hereinafter, embodiments will be described in detail with reference to the accompanying drawings. When describing embodiments with reference to the drawings, the same or corresponding elements are denoted by the same reference numerals, and redundant descriptions thereof are omitted.

In the following embodiments, terms such as "first" and "second" may be used to describe various elements, but such elements should not be limited to the above terms. The above terms are used to distinguish one element from another.

In the following embodiments, an expression used in the singular encompasses the expression of the plural, unless it has a clearly different meaning in the context.

In the following embodiments, terms such as "include" or "comprise" may be construed to denote a certain characteristic or element, or any combinations thereof, but may not be construed to exclude the existence of or a possibility of addition of one or more other characteristics, elements, and/or any combinations thereof.

In the following embodiments, when a layer, region, and/or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of description. For example, because sizes and thicknesses of elements in the drawings are arbitrarily illustrated for convenience of description, the invention is not limited thereto.

When an embodiment may be implemented differently, a certain process order may be performed differently from the described order. For example, two processes described in succession may be performed substantially simultaneously, or may be performed in an order opposite to the order described.

As used herein, "A and/or B" refers to A, B, or A and B. In addition, "at least one of A and B" refers to A, B, or A and B.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

In the following embodiments, when a layer, region, and/or element is referred to as being "connected" to another layer, region, and/or element, it may be "directly connected" to the other layer, region, or element, and/or may be "indirectly connected" to the other layer, region, and/or element with one or more intervening layers, regions, or elements therebetween. For example, when a layer, region, and/or element is referred to as being "electrically connected" to another layer, region, and/or element, it may be "directly electrically connected" to the other layer, region, and/or element, and/or may be "indirectly electrically connected" to the other layer, region, and/or element with one or more intervening layers, regions, and/or elements therebetween.

In the following embodiments, the x-axis, the y-axis, and the z-axis are not limited to three axes of a rectangular coordinate system, and may be interpreted in a broader sense. For example, the x-axis, the y-axis, and the z-axis may be orthogonal to each other, but may refer to different directions that are not orthogonal to each other.

FIG. 1 is a perspective view of a display device 1, according to an embodiment.

The display device 1 according to an embodiment, which is a device for displaying moving images or still images, may be used as a display screen of various products, such as a television, a laptop computer, a monitor, a billboard, and/or an Internet of Things (IoT) device, as well as portable electronic devices, such as a mobile phone, a smartphone, a tablet personal computer (PC), a mobile communication terminal, an electronic notebook, an electronic book, a portable multimedia player (PMP), a navigation device, and/or an ultra-mobile PC (UMPC). In addition, the display device 1 according to an embodiment may be used in a wearable device, such as a smart watch, a watch phone, a glasses-type display, and/or a head-mounted display (HMD). Furthermore, the display device 1 according to an embodiment may be used as an instrument panel of a vehicle, a center information display (CID) disposed on a center fascia and/or dashboard of a vehicle, a room mirror display replacing a side mirror of a vehicle, and/or a display disposed on a rear surface of a front seat as an entertainment device for a back seat of a vehicle.

In an embodiment and referring to FIG. 1, the display device 1 may have an edge in a first direction and an edge in a second direction. Here, the first direction and the second direction may cross each other. For example, the first direction and the second direction may form an acute angle with each other. As another example, the first direction and the second direction may form an obtuse angle with each other or be orthogonal to each other. Hereinafter, a case in which the first direction and the second direction are orthogonal to each other is mainly described in detail. For example, the first direction may be an x direction or a −x direction, and the second direction may be a y direction or a −y direction. A third direction that is perpendicular to the first direction and the second direction may be a z direction or a −z direction.

In an embodiment, the display device 1 may include a display area DA and a peripheral area PA outside the display area DA. The display device 1 may provide a certain image by using light emitted from a plurality of subpixels PX arranged in the display area DA. The peripheral area PA is arranged outside the display area DA and may be a type of non-display area in which subpixels are not arranged. The display area DA may be entirely surrounded by the peripheral area PA.

Hereinafter, an organic light-emitting display device is described as an example of the display device 1 according to an embodiment, but the display device 1 of the invention is not limited thereto. In another embodiment, the display device 1 of the invention may be an inorganic light-emitting display device (or an inorganic electroluminescent (EL) display device) or a quantum dot light-emitting display device. For example, in an embodiment, an emission layer of a display element included in the display device 1 may include an organic material or an inorganic material. In addition, in an embodiment, the display device 1 may include an emission layer and quantum dots located on a path of light emitted from the emission layer.

Figure 2:
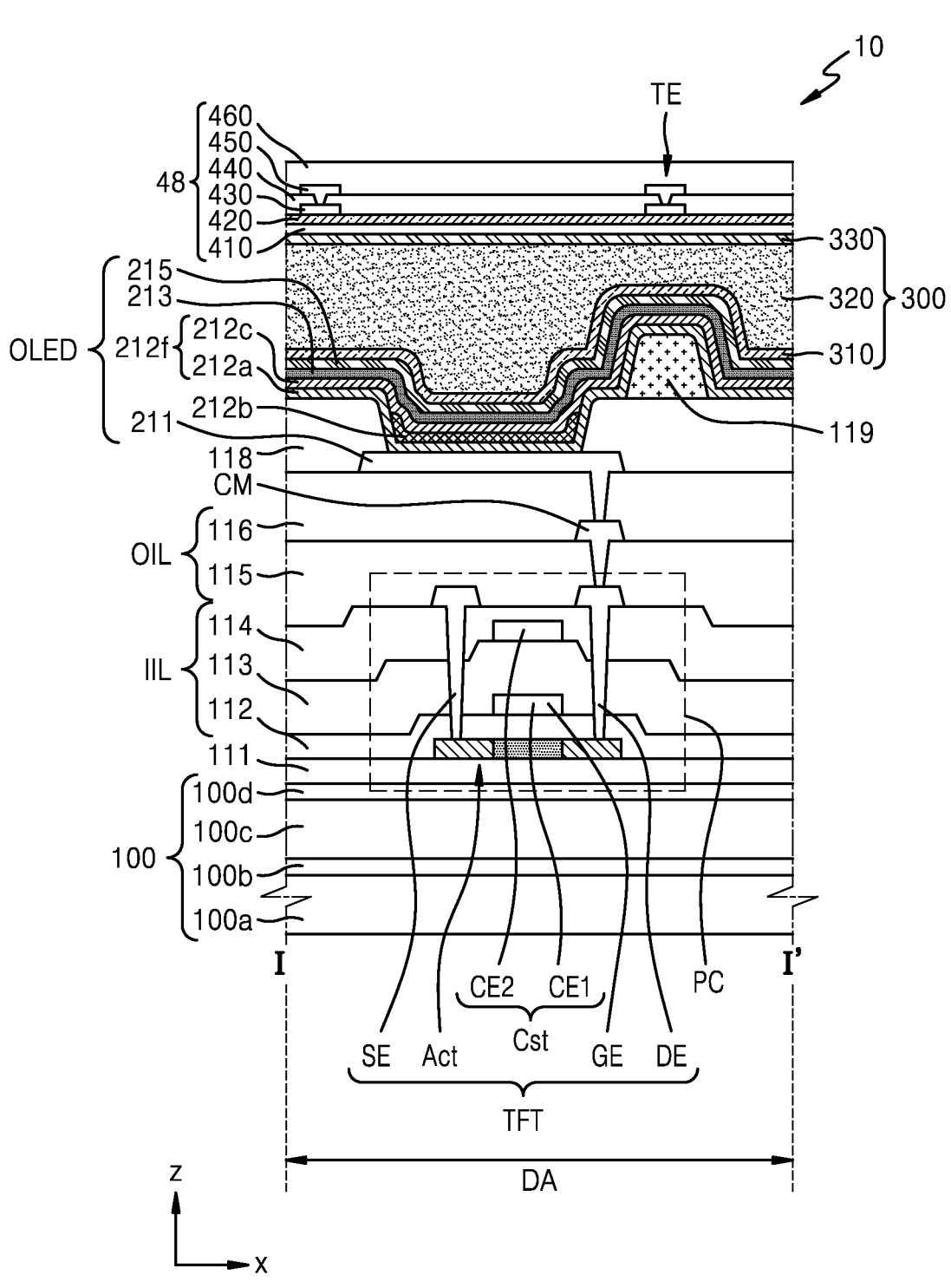
FIG. 2 is a schematic cross-sectional view of a display device, according to an embodiment.

FIG. 2 is a schematic cross-sectional view of the display device 1, according to an embodiment. In detail, FIG. 2 is a schematic cross-sectional view of the display area DA of the display device 1, according to an embodiment.

In an embodiment and referring to FIG. 2, a display panel 10 may include a substrate 100, an inorganic insulating layer IIL, an organic insulating layer OIL, a subpixel circuit PC, a connection electrode CM, an organic light-emitting diode OLED, a pixel-defining layer 118, a spacer 119, and an encapsulation layer 300. That is, the substrate 100, the inorganic insulating layer IIL, the organic insulating layer OIL, the subpixel circuit PC, the connection electrode CM, the organic light-emitting diode OLED, the pixel-defining layer 118, the spacer 119, and the encapsulation layer 300 may be arranged in the display area DA of the display panel 10.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked in a thickness direction of the substrate 100.

In an embodiment, at least one of the first base layer 100a and the second base layer 100c may include polymer resin, such as polyethersulfone, polyarylate, polyetherimide, polyethylene naphthalate, polyethylene terephthalate, polyphenylene sulfide, polyimide, polycarbonate, cellulose triacetate, and/or cellulose acetate propionate.

In an embodiment, the first barrier layer 100b and the second barrier layer 100d are barrier layers for preventing penetration of external foreign substances and may include a single layer and/or multiple layers including an inorganic material, such as silicon nitride ($SiN_x$), silicon oxide ($SiO_2$), and/or silicon oxynitride (SiON).

In an embodiment, a buffer layer 111 may be disposed on the substrate 100. The buffer layer 111 may include an inorganic insulating material, such as $SiN_x$, SiON, and/or $SiO_2$, and include a single layer or multiple layers including the above-described inorganic insulating material.

In an embodiment, the inorganic insulating layer IIL may be disposed on the buffer layer 111. The inorganic insulating layer IIL may include a first inorganic insulating layer 112, a second inorganic insulating layer 113, and a third inorganic insulating layer 114.

In an embodiment, the subpixel circuit PC may be arranged in the display area DA. The subpixel circuit PC may include a thin-film transistor TFT and a storage capacitor Cst. The thin-film transistor TFT may include a semiconductor layer Act, a gate electrode GE, a source electrode SE, and a drain electrode DE.

In an embodiment, the semiconductor layer Act may be disposed on the buffer layer 111. The semiconductor layer Act may include polysilicon. Alternatively, the semiconductor layer Act may include amorphous silicon, an oxide semiconductor, an organic semiconductor, or the like. The semiconductor layer Act may include a channel region, a drain region and a source region respectively arranged on both sides of the channel region.

In an embodiment, the gate electrode GE may be disposed on the semiconductor layer Act. The gate electrode GE may overlap the channel region. The gate electrode GE may include a low-resistance metal material. The gate electrode GE may include a conductive material including molybdenum (Mo), aluminum (Al), copper (Cu), titanium (Ti), or the like and include a single layer or multiple layers including the above-described material.

In an embodiment, the first inorganic insulating layer 112 may be arranged between the semiconductor layer Act and the gate electrode GE. The first inorganic insulating layer 112 may include an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), and/or zinc oxide (ZnO).

In an embodiment, the second inorganic insulating layer 113 may be disposed on the gate electrode GE. The second inorganic insulating layer 113 may cover the gate electrode GE. The second inorganic insulating layer 113 may include an inorganic insulating material, such as $SiO_2$, $SiN_x$, SiON, $Al_2O_3$, $TiO_2$, $Ta_2O_5$, $HfO_2$, and/or ZnO.

In an embodiment, an upper electrode CE2 of the storage capacitor Cst may be disposed on the second inorganic insulating layer 113. The upper electrode CE2 may overlap the gate electrode GE there-below. In this case, the gate electrode GE and the upper electrode CE2 overlapping each other with the second inorganic insulating layer 113 therebetween may form the storage capacitor Cst. That is, the gate electrode GE may function as a lower electrode CE1 of the storage capacitor Cst.

In an embodiment and as described above, the storage capacitor Cst may overlap the thin-film transistor TFT. However, the invention is not limited thereto. For example, the storage capacitor Cst may not overlap the thin-film transistor TFT. That is, the lower electrode CE1 of the storage capacitor Cst may be arranged apart from the gate electrode GE of the thin-film transistor TFT, as a separate element from the gate electrode GE of the thin-film transistor TFT.

In an embodiment, the upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu and include a single layer or multiple layers including the above-described material.

In an embodiment, the third inorganic insulating layer 114 may be disposed on the upper electrode CE2. The third inorganic insulating layer 114 may cover the upper electrode CE2. The third inorganic insulating layer 114 may include $SiO_2$, $SiN_x$, SiON, $Al_2O_3$, $TiO_2$, $Ta_2O_5$, $HfO_2$, and/or ZnO. The third inorganic insulating layer 114 may include a single layer or multiple layers including the above-described inorganic insulating material.

In an embodiment, each of the drain electrode DE and the source electrode SE may be disposed on the third inorganic insulating layer 114. Each of the drain electrode DE and the source electrode SE may be connected to the semiconductor layer Act via contact holes included in the first inorganic insulating layer 112, the second inorganic insulating layer 113, and the third inorganic insulating layer 114. The drain electrode DE and the source electrode SE may include a material having high conductivity. The drain electrode DE and the source electrode SE may include a conductive material including Mo, Al, Cu, Ti, or the like and include a single layer or multiple layers including the above-described material. For example, the drain electrode DE and the source electrode SE may have a multi-layered structure of Ti/Al/Ti.

In an embodiment, the organic insulating layer OIL may be disposed on the inorganic insulating layer IIL. The organic insulating layer OIL may include a first organic insulating layer 115 and a second organic insulating layer 116. Although FIG. 2 illustrates a embodiment in which two organic insulating layers OIL are provided, the invention is not limited thereto. In an embodiment, three or four organic insulating layers OIL may be provided.

In an embodiment, the first organic insulating layer 115 may cover the drain electrode DE and the source electrode SE. The first organic insulating layer 115 may include an organic insulating material, such as a general purpose polymer (e.g., polymethyl methacrylate (PMMA) or polystyrene (PS)), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and/or a blend thereof.

In an embodiment, the connection electrode CM may be disposed on the first organic insulating layer 115. In this embodiment, the connection electrode CM may be connected to the drain electrode DE or the source electrode SE via a contact hole of the first organic insulating layer 115. The connection electrode CM may include a material having high conductivity. The connection electrode CM may include a conductive material including Mo, Al, Cu, Ti, or the like and include a single layer or multiple layers including the above-described material. For example, the connection electrode CM may have a multi-layered structure of Ti/Al/Ti.

In an embodiment, the second organic insulating layer 116 may be disposed on the connection electrode CM. The second organic insulating layer 116 may cover the connection electrode CM. The second organic insulating layer 116 may include the same material as that of the first organic insulating layer 115 or include a material different from that of the first organic insulating layer 115.

In an embodiment, a light-emitting diode may be disposed on the second organic insulating layer 116. For example, the organic light-emitting diode OLED may be disposed on the second organic insulating layer 116. Alternatively, although not illustrated, an inorganic light-emitting diode or the like may be disposed on the second organic insulating layer 116.

In an embodiment, the organic light-emitting diode OLED may emit red, green, or blue light or emit red, green, blue, or white light. The organic light-emitting diode OLED may include a subpixel electrode 211, an emission layer 212b, a functional layer 212f, a counter electrode 213, and a capping layer 215.

In an embodiment, the subpixel electrode 211 may be disposed on the second organic insulating layer 116. The subpixel electrode 211 may be electrically connected to the connection electrode CM via a contact hole defined in the second organic insulating layer 116. The subpixel electrode 211 may include a conductive oxide, such as indium tin oxide (ITO), indium zinc oxide (IZO), ZnO, indium oxide ($In_2O_3$), indium gallium oxide (IGO), and/or aluminum zinc oxide (AZO). In an embodiment, the subpixel electrode 211 may include a reflective layer including Ag, Mg, Al, Pt, Pd, Au, Ni, Nd, Ir, Cr, and/or a compound thereof. In an embodiment, the subpixel electrode 211 may further include a layer including ITO, IZO, ZnO, and/or $In_2O_3$ above/below the reflective layer. For example, the subpixel electrode 211 may have a multi-layered structure of ITO/Ag/ITO.

In an embodiment, the pixel-defining layer 118 having an opening exposing at least a portion of the subpixel electrode 211 may be disposed on the subpixel electrode 211. An emission area of light emitted from the organic light-emitting diode OLED may be defined by the opening defined in the pixel-defining layer 118. For example, in an embodiment, the width of the opening may correspond to the width of the emission area.

In an embodiment, the pixel-defining layer 118 may include an organic insulating material. Alternatively, in an embodiment, the pixel-defining layer 118 may include an inorganic insulating material, such as $SiN_x$, SiON, or $SiO_2$. Alternatively, in another embodiment, the pixel-defining layer 118 may include an organic insulating material and an inorganic insulating material. In an embodiment, the pixel-defining layer 118 may include a light-blocking material. The light-blocking material may include carbon black, carbon nanotubes, resin and/or paste including black dye, metal particles (e.g., Ni, Al, Mo, and/or an alloy thereof), metal oxide particles (e.g., chromium oxide), and/or metal nitride particles (e.g., chromium nitride). When the pixel-defining layer 118 includes a light-blocking material, external light reflection by metal structures disposed below the pixel-defining layer 118 may be reduced.

In an embodiment, the spacer 119 may be disposed on the pixel-defining layer 118. The spacer 119 may include an organic insulating material, such as polyimide. Alternatively, in an embodiment, the spacer 119 may include an inorganic insulating material, such as $SiN_x$ or $SiO_2$, or include an organic insulating material and an inorganic insulating material.

In an embodiment, the spacer 119 may include the same material as that of the pixel-defining layer 118. In this embodiment, the pixel-defining layer 118 and the spacer 119 may be formed together in a mask process using a halftone mask or the like. Alternatively, in an embodiment, the spacer 119 may include a material different from that of the pixel-defining layer 118.

In an embodiment, the emission layer 212b may be arranged in the opening of the pixel-defining layer 118. The emission layer 212b may include a polymer or low-molecular weight organic material emitting light of a certain color.

In an embodiment, the functional layer 212f may include a first functional layer 212a and a second functional layer 212c. The first functional layer 212a may be arranged between the subpixel electrode 211 and the emission layer 212b, and the second functional layer 212c may be arranged between the emission layer 212b and the counter electrode 213. However, at least one of the first functional layer 212a and the second functional layer 212c may be omitted. Hereinafter, an embodiment in which the first functional layer 212a and the second functional layer 212c are disposed will be described in detail.

In an embodiment, the first functional layer 212a may include a hole transport layer (HTL) and/or a hole injection layer (HIL). The second functional layer 212c may include an electron transport layer (ETL) and/or an electron injection layer (EIL). The first functional layer 212a and/or the second functional layer 212c may be a common layer formed to entirely cover the substrate 100, like the counter electrode 213 to be described below.

In an embodiment, the counter electrode 213 may be disposed on the functional layer 212f. The counter electrode 213 may include a conductive material having a low work function. For example, the counter electrode 213 may include a (semi) transparent layer including Ag, Mg, Al, Pt, Pd, Au, Ni, Nd, Ir, Cr, lithium (Li), Ca, and/or an alloy thereof. Alternatively, in an embodiment, the counter electrode 213 may further include a layer including ITO, IZO, ZnO, and/or $In_2O_3$ on the (semi) transparent layer including the above-described material.

In an embodiment, the capping layer 215 may be disposed on the counter electrode 213. The capping layer 215 may include lithium fluoride (LiF), an inorganic material, and/or an organic material.

In an embodiment, the encapsulation layer 300 may be disposed on the organic light-emitting diode OLED. The encapsulation layer 300 may cover the organic light-emitting diode OLED. The encapsulation layer 300 may be disposed on the counter electrode 213 and/or the capping layer 215. In an embodiment, the encapsulation layer 300 may include at least one inorganic layer and at least one organic layer. FIG. 2 illustrates that the encapsulation layer 300 includes a first inorganic encapsulation layer 310, an organic encapsulation layer 320, and a second inorganic encapsulation layer 330 that are sequentially stacked.

In an embodiment, the first inorganic encapsulation layer 310 and the second inorganic encapsulation layer 330 may include one or more inorganic materials from among $Al_2O_3$, $TiO_2$, $Ta_2O_5$, $HfO_2$, ZnO, $SiO_2$, $SiN_x$, and/or SiON. The first inorganic encapsulation layer 310 and the second inorganic encapsulation layer 330 may include a single layer or multiple layers including the above-described material. The organic encapsulation layer 320 may include a polymer-based material. The polymer-based material may include acrylic resin, epoxy-based resin, polyimide, polyethylene, and/or the like. In an embodiment, the organic encapsulation layer 320 may include acrylate.

In an embodiment, an input sensing layer 48 may be disposed on the encapsulation layer 300. The input sensing layer 48 may include a first touch insulating layer 410, a second touch insulating layer 420, a first conductive layer 430, a third touch insulating layer 440, a second conductive layer 450, and a planarization layer 460.

In an embodiment, the first touch insulating layer 410 may be disposed on the second inorganic encapsulation layer 330, and the second touch insulating layer 420 may be disposed on the first touch insulating layer 410. In an embodiment, the first touch insulating layer 410 and the second touch insulating layer 420 may include an inorganic insulating material and/or an organic insulating material. For example, the first touch insulating layer 410 and the second touch insulating layer 420 may include an inorganic insulating material, such as $SiO_2$, $SiN_x$, and/or SiON.

In an embodiment, at least one of the first touch insulating layer 410 and the second touch insulating layer 420 may be omitted. For example, the first touch insulating layer 410 may be omitted. In this embodiment, the second touch insulating layer 420 may be disposed on the second inorganic encapsulation layer 330, and the first conductive layer 430 may be disposed on the second touch insulating layer 420.

In an embodiment, the first conductive layer 430 may be disposed on the second touch insulating layer 420, and the third touch insulating layer 440 may be disposed on the first conductive layer 430. In an embodiment, the third touch insulating layer 440 may include an inorganic insulating material and/or an organic insulating material. For example, the third touch insulating layer 440 may include an inorganic insulating material, such as $SiO_2$, $SiN_x$, and/or SiON.

In an embodiment, the second conductive layer 450 may be disposed on the third touch insulating layer 440. A touch electrode TE of the input sensing layer 48 may have a structure in which the first conductive layer 430 and the second conductive layer 450 are connected to each other. Alternatively, in an embodiment, the touch electrode TE may be formed on any one of the first conductive layer 430 and the second conductive layer 450 and include a metal line included in the corresponding conductive layer. Each of the first conductive layer 430 and the second conductive layer 450 may include at least one of Al, Cu, Ti, Mo, and ITO and include a single layer or multiple layers including the above-described material. For example, each of the first conductive layer 430 and the second conductive layer 450 may have a three-layered structure of Ti layer/Al layer/Ti layer.

In an embodiment, the planarization layer 460 may cover the second conductive layer 450. The planarization layer 460 may include an organic insulating material.

Figure 3:
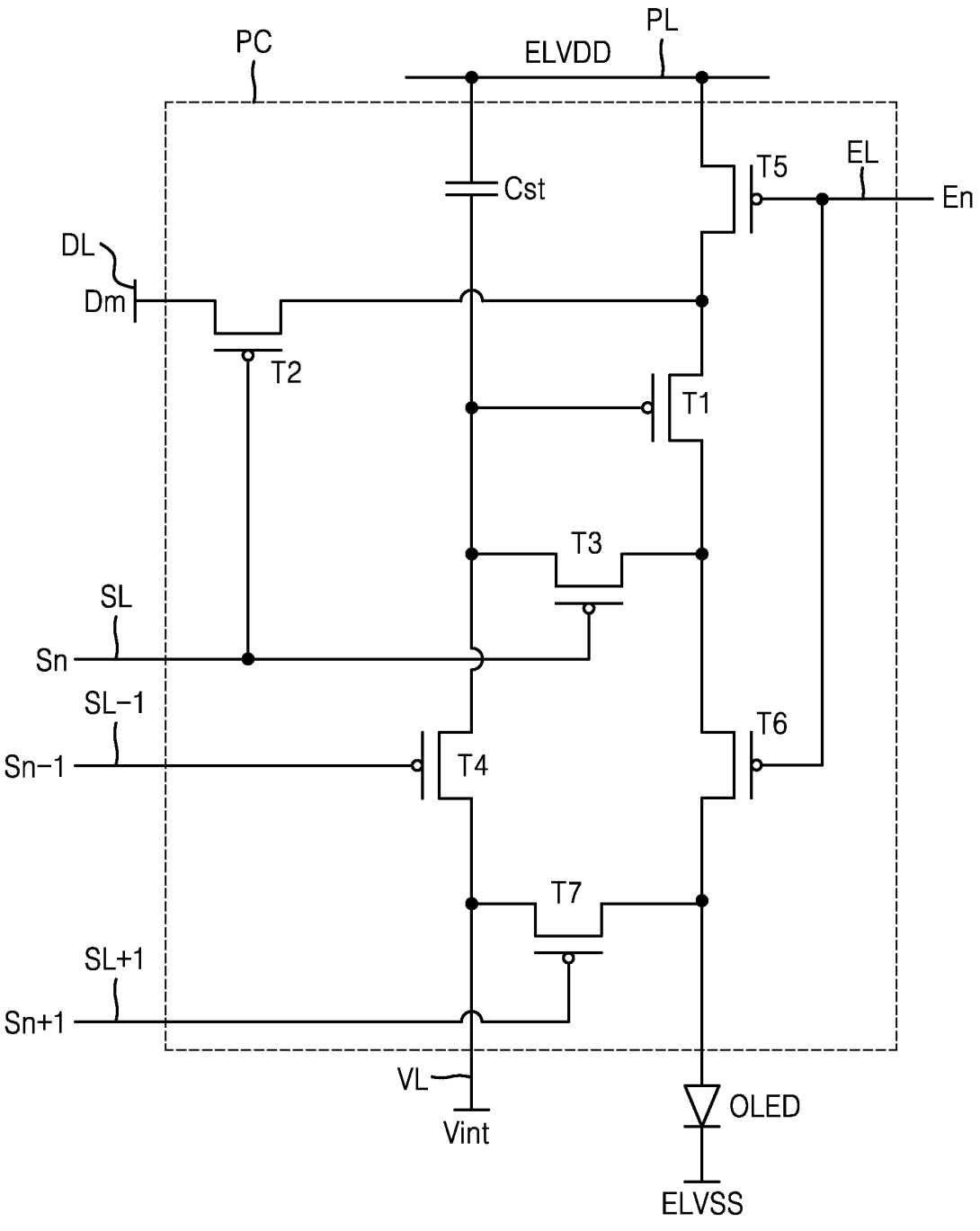
FIG. 3 is a schematic equivalent circuit diagram of a subpixel circuit electrically connected to a subpixel, according to an embodiment.

FIG. 3 is a schematic equivalent circuit diagram of the subpixel circuit PC electrically connected to a subpixel, according to an embodiment.

In an embodiment and referring to FIG. 3, the subpixel may emit light through the organic light-emitting diode OLED, and the organic light-emitting diode OLED may be electrically connected to the subpixel circuit PC.

In an embodiment, the subpixel circuit PC may include a first transistor T1, a second transistor T2, a third transistor T3, a fourth transistor T4, a fifth transistor T5, a sixth transistor T6, a seventh transistor T7, and the storage capacitor Cst.

In an embodiment, the first transistor T1, which is a driving thin-film transistor, may be connected to a driving voltage line PL and the storage capacitor Cst and configured to control a driving current flowing from the driving voltage line PL to the organic light-emitting diode OLED, in response to a voltage value stored in the storage capacitor Cst. The organic light-emitting diode OLED may emit light having a certain luminance according to the driving current. A second electrode (e.g., a cathode) of the organic light-emitting diode OLED may receive a common voltage ELVSS.

In an embodiment, the second transistor T2, which is a switching thin-film transistor, may be connected to a signal line SL and a data line DL and configured to transmit a data voltage (or data signal) Dm received via the data line DL to the first transistor T1, based on a scan signal (or scan voltage, switching voltage, or switching signal) Sn received via the signal line SL.

In an embodiment, the storage capacitor Cst may be connected to the driving voltage line PL and the first transistor T1. One electrode of the storage capacitor Cst may be connected to the driving voltage line PL, and the other electrode of the storage capacitor Cst may be connected to a gate electrode of the first transistor T1. The storage capacitor Cst may store a difference between a driving voltage ELVDD applied to the driving voltage line PL and a gate voltage of the first transistor T1 and maintain the gate voltage of the first transistor T1.

In an embodiment, the third transistor T3 is a compensation thin-film transistor, and a gate electrode of the third transistor T3 may be connected to the signal line SL. A source electrode (or drain electrode) of the third transistor T3 may be connected to a drain electrode (or source electrode) of the first transistor T1 and connected to a first electrode (e.g., an anode) of the organic light-emitting diode OLED via the sixth transistor T6. The drain electrode (or source electrode) of the third transistor T3 may be connected to the other electrode of the storage capacitor Cst, a source electrode (or drain electrode) of the fourth transistor T4, and the gate electrode of the first transistor T1. The third transistor T3 may be turned on according to the scan signal Sn received via the signal line SL and connect the gate electrode and the drain electrode of the first transistor T1 to each other to diode-connect the first transistor T1.

In an embodiment, the fourth transistor T4 is an initialization thin-film transistor, and a gate electrode of the fourth transistor T4 may be connected to a previous signal line SL−1. The drain electrode (or source electrode) of the fourth transistor T4 may be connected to an initialization voltage line VL. The source electrode (or drain electrode) of the fourth transistor T4 may be connected to the other electrode of the storage capacitor Cst, the drain electrode (or source electrode) of the third transistor T3, and the gate electrode of the first transistor T1. The fourth transistor T4 may be turned on according to a previous scan signal Sn−1 received via the previous signal line SL−1 and configured to transmit an initialization voltage Vint to the gate electrode of the first transistor T1 to perform an initialization operation of initializing a voltage of the gate electrode of the first transistor T1.

In an embodiment, the fifth transistor T5 is an operation control thin-film transistor, and a gate electrode of the fifth transistor T5 may be connected to an emission control line EL. A source electrode (or drain electrode) of the fifth transistor T5 may be connected to the driving voltage line PL. The drain electrode (or source electrode) of the fifth transistor T5 may be connected to the source electrode (or drain electrode) of the first transistor T1 and a drain electrode (or source electrode) of the second transistor T2.

In an embodiment, the sixth transistor T6 is an emission control thin-film transistor, and a gate electrode of the sixth transistor T6 may be connected to the emission control line EL. A source electrode (or drain electrode) of the sixth transistor T6 may be connected to the drain electrode (or source electrode) of the first transistor T1 and the source electrode (or drain electrode) of the third transistor T3. The drain electrode (or source electrode) of the sixth transistor T6 may be electrically connected to the first electrode of the organic light-emitting diode OLED. The fifth transistor T5 and the sixth transistor T6 may be simultaneously turned on according to an emission control signal En received via the emission control line EL, so that the driving voltage ELVDD is transmitted to the organic light-emitting diode OLED and a driving current flows in the organic light-emitting diode OLED.

In an embodiment, the seventh transistor T7 may be an initialization thin-film transistor for initializing the first electrode of the organic light-emitting diode OLED. A gate electrode of the seventh transistor T7 may be connected to a next signal line SL+1. A source electrode (or drain electrode) of the seventh transistor T7 may be connected to the first electrode of the organic light-emitting diode OLED. The drain electrode (or source electrode) of the seventh transistor T7 may be connected to the initialization voltage line VL. The seventh transistor T7 may be turned on according to a next scan signal Sn+1 received via the next signal line SL+1 and initialize the first electrode of the organic light-emitting diode OLED.

Although FIG. 3 illustrates an embodiment in which the fourth transistor T4 and the seventh transistor T7 are respectively connected to the previous signal line SL−1 and the next signal line SL+1, in an embodiment, the fourth transistor T4 and the seventh transistor T7 may both be connected to the previous signal line SL−1 and driven according to the previous scan signal Sn−1.

In an embodiment, one electrode of the storage capacitor Cst may be connected to the driving voltage line PL. The other electrode of the storage capacitor Cst may be connected to the gate electrode of the first transistor T1, the drain electrode (or source electrode) of the third transistor T3, and the source electrode (or drain electrode) of the fourth transistor T4.

In an embodiment, the second electrode of the organic light-emitting diode OLED may receive the common voltage ELVSS. The organic light-emitting diode OLED may receive a driving current from the first transistor T1 to emit light.

In an embodiment, all of the first to seventh transistors T1 to T7, respectively, may include a semiconductor layer including silicon. However, the invention is not limited thereto.

In an embodiment, at least one transistor among the first to seventh transistors T1 to T7, respectively, may include a semiconductor layer including an oxide, and the remaining transistors may include a semiconductor layer including silicon. In detail, the first transistor T1, which directly affects the brightness of the display panel 10, may include a silicon semiconductor including polycrystalline silicon having high reliability, and thus, the display panel 10 may be implemented with high resolution.

In an embodiment, because an oxide semiconductor has high carrier mobility and low leakage current, a voltage drop may not be large even when a driving time is long. That is, because a color change of an image according to the voltage drop is not large even during low-frequency driving, low-frequency driving may be possible. Because an oxide semiconductor has an advantage of low leakage current, as described above, at least one of the third transistor T3 and the fourth transistor T4, which are connected to the gate electrode of the first transistor T1, may include an oxide semiconductor so as to prevent leakage current that may flow to the gate electrode of the first transistor T1 and to simultaneously reduce power consumption. In this embodiment, a signal line and/or a voltage line may be added to the subpixel circuit PC of FIG. 3. In addition, transistors other than the third transistor T3 and the fourth transistor T4 may include a semiconductor layer including an oxide. For example, the seventh transistor T7 may include a semiconductor layer including an oxide semiconductor.

Figure 4:
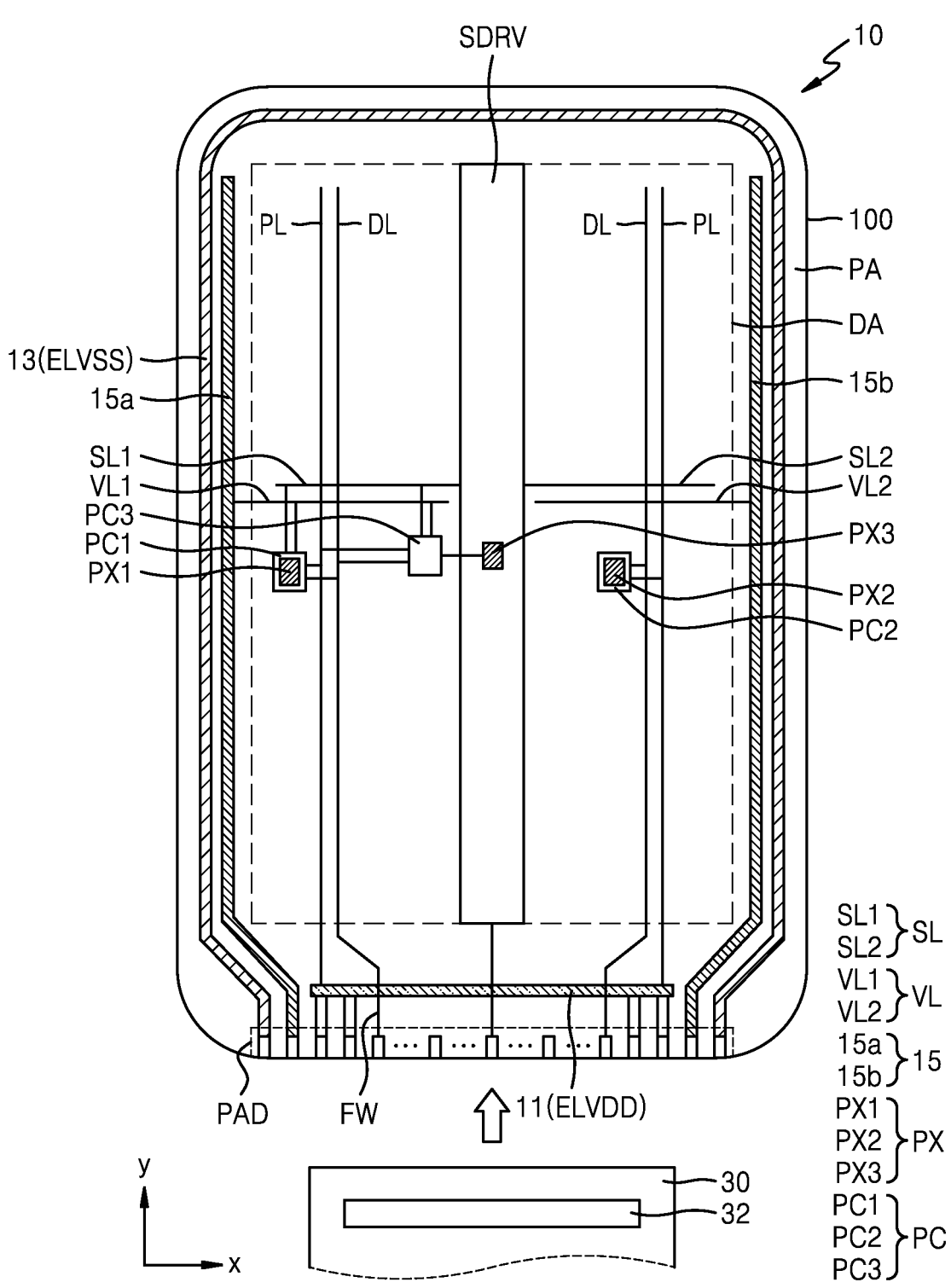
FIG. 4 is a schematic plan view of a display panel according to an embodiment.

FIG. 4 is a schematic plan view of the display panel 10, according to an embodiment.

In an embodiment and referring to FIG. 4, the display panel 10 may include a circuit driver SDRV, a terminal portion PAD, a data driver 32, and a power supply line that is disposed on the substrate 100. The power supply line may include a driving voltage supply line 11 and a common voltage supply line 13.

In an embodiment, the substrate 100 (see FIG. 2) may include the display area DA and the peripheral area PA outside the display area DA. A portion of the peripheral area PA may extend in one direction (e.g., the y direction). The terminal portion PAD, the driving voltage supply line 11, the common voltage supply line 13, an initialization voltage driver 15, and the like may be arranged in the peripheral area PA. In an embodiment, the width of the extended portion of the peripheral area PA in the x direction may be less than the width of the display area DA in the x direction. Unlike the initialization voltage driver 15, the driving voltage supply line 11, the common voltage supply line 13, and the like, the circuit driver SDRV may be arranged in a central portion of the display area DA to extend in the second direction (e.g., the y direction). When the circuit driver SDRV is arranged in the central portion of the display area DA, the area of the peripheral area PA, that is, the area in which the subpixel PX is not arranged in the display device 1 may be reduced, thereby positively affecting the resolution or the like of the display device 1.

In an embodiment, a plurality of subpixels PX may be arranged in the display area DA. Each of the subpixels PX may be implemented by a display element, such as an organic light-emitting diode. Each of the subpixels PX may emit, for example, red, green, blue, and/or white light.

In detail, in an embodiment, a first subpixel PX1 may be arranged at one side of the display area DA. A second subpixel PX2 may be arranged at the other side of the display area DA. A third subpixel PX3 may be arranged to overlap the circuit driver SDRV arranged in the central portion of the display area DA.

In an embodiment, each of a first subpixel circuit PC1, a second subpixel circuit PC2, and a third subpixel circuit PC3 for respectively driving the first subpixel PX1, the second subpixel PX2, and the third subpixel PX3 may be arranged in the display area DA. The first subpixel circuit PC1 may be arranged in the display area DA to overlap the first subpixel PX1, and the second subpixel circuit PC2 may be arranged in the display area DA to overlap the second subpixel PX2. The third subpixel circuit PC3 may be arranged around the circuit driver SDRV in the display area DA. In other words, the third subpixel circuit PC3 may be arranged not to overlap the third subpixel PX3.

In an embodiment, each of the subpixel circuits PC driving the subpixels PX in the display area DA may be connected to a signal line or a voltage line configured to control on/off, luminance, and the like of a display element, such as a light-emitting diode. For example, FIG. 4 illustrates a first signal line SL1 and a second signal line SL2 extending in the first direction (e.g., the x direction or the −x direction) and the data line DL extending in the second direction (e.g., the y direction or the −y direction) as signal lines and illustrates the driving voltage line PL as a voltage line. In detail, the first signal line SL1 extends at one side of the display area DA in the first direction (e.g., the x direction or the −x direction), and the second signal line SL2 extends at the other side of the display area DA in the first direction (e.g., the x direction or the −x direction). In addition, the subpixel circuits PC may be connected to the initialization voltage driver 15 and connected to the initialization voltage line VL extending in the first direction (e.g., the x direction or the −x direction). In detail, the initialization voltage line VL may include a first initialization voltage line VL1 extending at one side of the display area DA in the first direction (e.g., the x direction or the −x direction) and a second initialization voltage line VL2 extending at the other side of the display area DA in the first direction (e.g., the x direction or the −x direction).

In an embodiment, the subpixel circuit PC driving the subpixel PX may be electrically connected to external circuits arranged in the peripheral area PA or the display area DA. The circuit driver SDRV may be arranged in the central portion of the display area DA to extend in the second direction (e.g., the y direction or the −y direction). The terminal portion PAD, the data driver 32, the driving voltage supply line 11, the common voltage supply line 13, and the initialization voltage driver 15 may be arranged in the peripheral area PA.

In an embodiment, the circuit driver SDRV arranged in the central portion of the display area DA may generate a scan signal and transmit the scan signal to each subpixel circuit PC via the signal line SL. In detail, the circuit driver SDRV may provide a scan signal to the first subpixel circuit PC1 arranged at one side of the display area DA via the first signal line SL1. In addition, the circuit driver SDRV may provide a scan signal to the second subpixel circuit PC2 arranged at the other side of the display area DA via the second signal line SL2.

In an embodiment, the terminal portion PAD may be arranged at one side of the substrate 100. The terminal portion PAD is exposed without being covered by an insulating layer and may be electrically connected to a controller, such as a display circuit board 30. Control signals of the controller may be respectively provided to the circuit driver SDRV, the data driver 32, the driving voltage supply line 11, and the common voltage supply line 13 via the terminal portion PAD. In addition, the data driver 32 may be disposed on the display circuit board 30. The data driver 32 generates a data signal and transmits the data signal to each subpixel circuit PC via a fan-out line FW and the data line DL connected to the fan-out line FW.

In an embodiment, the driving voltage supply line 11 may be arranged in the peripheral area PA. The driving voltage supply line 11 may be configured to provide the driving voltage ELVDD to each subpixel PX. The driving voltage supply line 11 may be arranged in the peripheral area PA and connected to a plurality of driving voltage lines PL extending to the display area DA in the second direction (e.g., the y direction).

In an embodiment, the common voltage supply line 13 may be arranged in the peripheral area PA and configured to provide the common voltage ELVSS to each subpixel PX.

In an embodiment, the initialization voltage driver 15 may include a first initialization voltage driver 15*a* extending at one side of the peripheral area PA in the second direction (e.g., the y direction or the −y direction) and a second initialization voltage driver 15*b* extending at the other side of the peripheral area PA in the second direction (e.g., the y direction or the −y direction). An initialization voltage may be supplied to the first subpixel circuit PC1 via the first initialization voltage line VL1 connected from the first initialization voltage driver 15*a* and extending in the first direction (e.g., the x direction or the −x direction). An initialization voltage may be supplied to the second subpixel circuit PC2 via the second initialization voltage line VL2 connected from the second initialization voltage driver 15*b* and extending in the first direction (e.g., the x direction or the −x direction).

Figure 5:
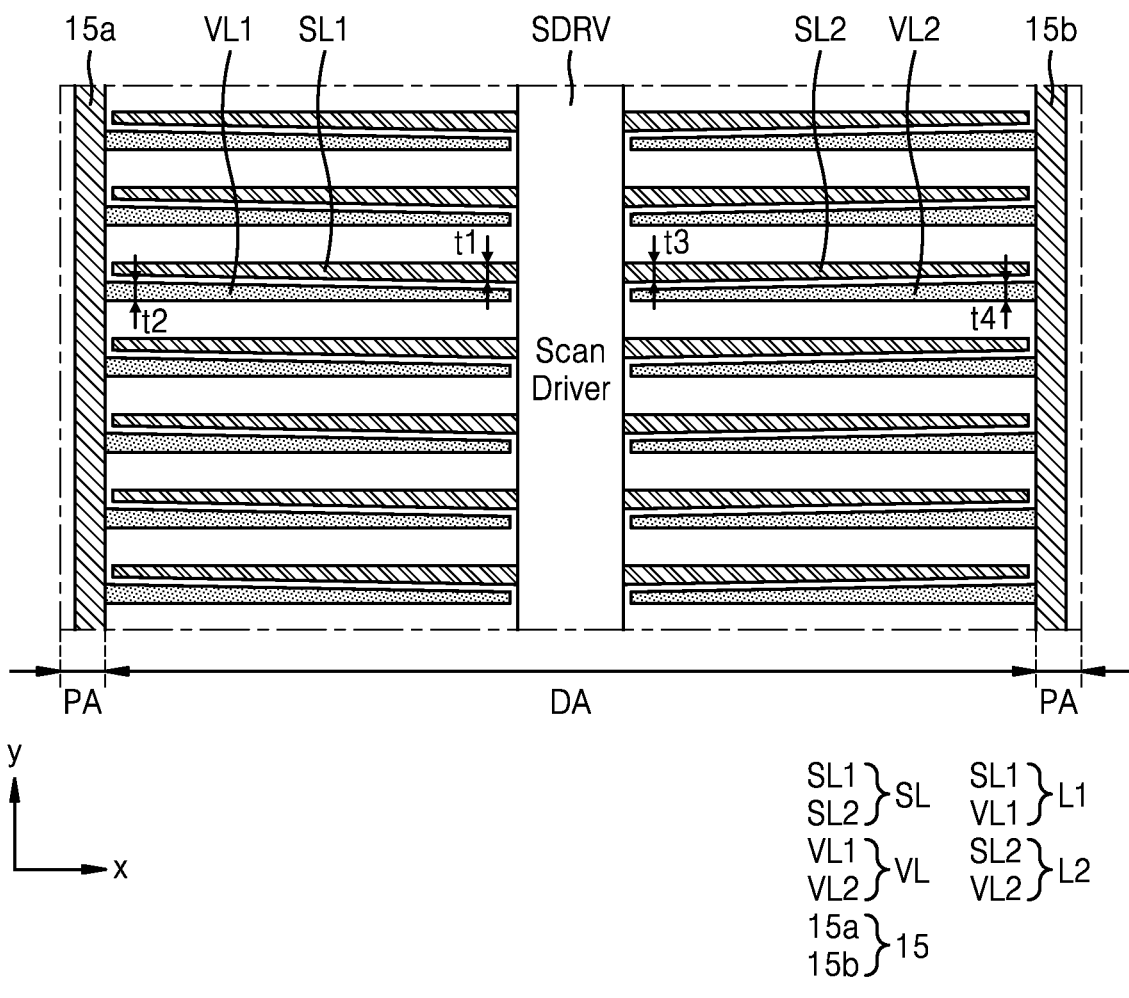
FIG. 5 is a schematic enlarged view of a portion of a plan view of a display panel, according to an embodiment.

FIG. 5 is a schematic enlarged view of a portion of a plan view of the display panel 10, according to an embodiment. In detail, FIG. 5 schematically illustrates the circuit driver SDRV, the initialization voltage driver 15, the signal line SL, and the initialization voltage line VL included in the display panel 10.

In an embodiment and referring to FIG. 5, the circuit driver SDRV may be arranged in the central portion of the display area DA to extend in the second direction (e.g., the y direction or the –y direction). The first initialization voltage driver 15*a* may be arranged at one side of the peripheral area PA to extend in the second direction (e.g., the y direction or the –y direction). The second initialization voltage driver 15*b* may be arranged on the other side of the peripheral area PA to extend in the second direction (e.g., the y direction or the –y direction).

In an embodiment, the first signal line SL1 configured to transmit a scan signal to the subpixel circuit PC (see FIG. 4) arranged at one side of the display area DA may be connected from the circuit driver SDRV and extend in the first direction (e.g., the x direction or the –x direction). The second signal line SL2 configured to transmit a scan signal to the subpixel circuit PC (see FIG. 4) arranged on the other side of the display area DA may be connected from the circuit driver SDRV and extend in the first direction (e.g., the x direction or the –x direction).

In an embodiment, the first initialization voltage line VL1 configured to transmit an initialization voltage to the subpixel circuit PC (see FIG. 4) arranged at one side of the display area DA may be connected from the first initialization voltage driver 15*a* and extend in the first direction (e.g., the x direction or the –x direction). The second initialization voltage line VL2 configured to transmit an initialization voltage to the subpixel circuit PC (see FIG. 4) arranged at the other side of the display area DA may be connected from the second initialization voltage driver 15*b* and extend in the first direction (e.g., the x direction or the –x direction).

In an embodiment, the first initialization voltage line VL1 and the first signal line SL1 may be arranged adjacent to each other, and the second initialization voltage line VL2 and the second signal line SL2 may be arranged adjacent to each other.

In an embodiment, the first signal line SL1 may have a first width t1 in the second direction (e.g., the y direction or the –y direction). The first width t1 of the first signal line SL1 may decrease consistently from the circuit driver SDRV toward the peripheral area PA. In other words, the first width t1 of the first signal line SL1 may increase consistently from the peripheral area PA toward the circuit driver SDRV. Because a portion of the first signal line SL1 adjacent to the circuit driver SDRV has a large amount of carriers emitted from the circuit driver SDRV, to efficiently transmit the carriers to the subpixel circuits PC (see FIG. 4), the first width t1 of the portion of the first signal line SL1 adjacent to the circuit driver SDRV may be greater than the first width t1 of a portion of the first signal line SL1 apart from the circuit driver SDRV. In other words, to efficiently transmit the carriers emitted from the circuit driver SDRV to the subpixel circuits PC (see FIG. 4) of the display area DA, the first width t1 of the first signal line SL1 may decrease consistently from the circuit driver SDRV toward the peripheral area PA.

In an embodiment, the first initialization voltage line VL1 may have a second width t2 in the second direction (e.g., the y direction or the –y direction). The second width t2 of the first initialization voltage line VL1 may decrease consistently from the first initialization voltage driver 15*a* toward the circuit driver SDRV. In other words, the second width t2 of the first initialization voltage line VL1 may increase consistently from the circuit driver SDRV toward the first initialization voltage driver 15*a*. Because a portion of the first initialization voltage line VL1 adjacent to the first initialization voltage driver 15*a* has a large amount of carriers emitted from the first initialization voltage driver 15*a*, to efficiently transmit the carriers to the subpixel circuits PC (see FIG. 4), the second width t2 of the portion of the first initialization voltage line VL1 adjacent to the first initialization voltage driver 15*a* may be greater than the second width t2 of a portion of the first initialization voltage line VL1 apart from the first initialization voltage driver 15*a*. In other words, to efficiently transmit the carriers emitted from the first initialization voltage driver 15*a* to the subpixel circuits PC (see FIG. 4) of the display area DA, the second width t2 of the first initialization voltage line VL1 may decrease consistently from the first initialization voltage driver 15*a* toward the circuit driver SDRV.

In an embodiment, when the display device 1 (see FIG. 1) is viewed in a direction perpendicular to the substrate 100 (see FIG. 4), the first width t1 of the first signal line SL1 and the second width t2 of the first initialization voltage line VL1, the first signal line SL1 and the first initialization voltage line VL1 being adjacent to each other, may be constant at any point of the display device 1 in the first direction (e.g. the x direction or the –x direction). This is because the amount of carriers emitted from the first initialization voltage driver 15*a* and the amount of carriers emitted from the circuit driver SDRV are the same.

In an embodiment, a first wiring portion L1 may include the first signal line SL1 and the first initialization voltage line VL1. A plurality of first wiring portions L1 may be arranged apart from each other at regular intervals in a line at one side of the display area DA.

In an embodiment, the second initialization voltage line VL2 extending from the second initialization voltage driver 15*b* in the first direction (e.g., the x direction or the –x direction) and the second signal line SL2 extending from the circuit driver SDRV in the first direction (e.g., the x direction or the –x direction) may be arranged at the other side of the display area DA. The second signal line SL2 may have a third width t3 in the second direction (e.g., the y direction or the –y direction). The third width t3 of the second signal line SL2 may decrease consistently from the circuit driver SDRV toward the peripheral area PA. In other words, the third width t3 of the second signal line SL2 may increase consistently from the peripheral area PA toward the circuit driver SDRV.

In an embodiment, the second initialization voltage line VL2 may have a fourth width t4 in the second direction (e.g., the y direction or the –y direction). The fourth width t4 of the second initialization voltage line VL2 may decrease consistently from the second initialization voltage driver 15*b* toward the circuit driver SDRV. In other words, the fourth width t4 of the second initialization voltage line VL2 may increase consistently from the circuit driver SDRV toward the second initialization voltage driver 15*b*.

In an embodiment, when the display device 1 (see FIG. 1) is viewed in the direction perpendicular to the substrate 100 (see FIG. 4), the third width t3 of the second signal line SL2 and the fourth width t4 of the second initialization voltage line VL2, the second signal line SL2 and the second initialization voltage line VL2 being adjacent to each other, may be constant at any point of the display device 1 in the first direction (e.g. the x direction or the –x direction).

In an embodiment, a second wiring portion L2 may include the second signal line SL2 and the second initialization voltage line VL2. A plurality of second wiring portions L2 may be arranged apart from each other at regular intervals in a line at the other side of the display area DA.

In the embodiment of a switching transistor, as the ratio of the length to the width of the semiconductor layer Act (see FIG. 2) overlapping the gate electrode GE (see FIG. 2) increases, the switching capability of the switching transistor may be improved. In the embodiment of a switching transistor arranged apart from the circuit driver SDRV, because the signal line SL arranged apart from the circuit driver SDRV has a small width in the second direction (e.g., the y direction or the −y direction), the switching capability of the switching transistor may be improved without increasing the thickness of the semiconductor layer Act (see FIG. 2) of the switching transistor in the direction perpendicular to the substrate 100 (see FIG. 2). In other words, the width in the direction perpendicular to the substrate 100 of the semiconductor layer Act of the switching transistor arranged apart from the circuit driver SDRV may be less than the width in the direction perpendicular to the substrate 100 of the semiconductor layer Act of a switching transistor arranged adjacent to the circuit driver SDRV.

In an embodiment, the resolution of the display device 1 may be improved by arranging the circuit driver SDRV in the center of the display area DA to reduce the area of the peripheral area PA in which the subpixel PX is not arranged.

In addition, in an embodiment, the width in the second direction (e.g., the y direction or the −y direction) of the signal line SL connected from the circuit driver SDRV may decrease consistently from the circuit driver SDRV toward the peripheral area PA, and the width in the second direction (e.g., the y direction or the −y direction) of the initialization voltage line VL connected from the initialization voltage driver 15 may decrease consistently from the initialization voltage driver 15 toward the circuit driver SDRV.

In an embodiment, because portions of the signal line SL and the initialization voltage line VL respectively located adjacent to the circuit driver SDRV and the initialization voltage driver 15 have large amounts of carriers emitted from the circuit driver SDRV and the initialization voltage driver 15, respectively, when the widths in the second direction (e.g., the y direction or the −y direction) of the portions of the signal line SL and the initialization voltage line VL respectively located adjacent to the circuit driver SDRV and the initialization voltage driver 15, are greater than the widths in the second direction (e.g., the y direction or the −y direction) of portions of the signal line SL and the initialization voltage line VL respectively located apart from the circuit driver SDRV and the initialization voltage driver 15, the carriers may be efficiently transmitted to the subpixel circuit PC, and as a result, the reliability and resolution of the display device 1 may be improved.

According to the one or more embodiments as described above, a display device with improved reliability and resolution may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims. Accordingly, the scope of the various embodiments of the present invention should be interpreted to include, in addition to the embodiments disclosed herein, all alterations or modifications derived from the technical ideas of the various embodiments of the present invention. Moreover, the embodiments or parts of the embodiments may be combined in whole or in part without departing from the scope of the invention.

What is claimed is:

1. A display device comprising:
a substrate comprising a display area and a peripheral area outside the display area;
a circuit driver arranged in a central portion of the display area and extending in a first direction; and
a first signal line connected to the circuit driver and extending on one side of the display area in a second direction crossing the first direction,
wherein the first signal line has a first width directed in the first direction, wherein the first width decreases consistently as the first signal line extends from the circuit driver toward the peripheral area.

2. The display device of claim 1, further comprising:
a first initialization voltage driver arranged on one side of the peripheral area and extending in the first direction; and
a first initialization voltage line connected to the first initialization voltage driver and extending in the second direction,
wherein the first initialization voltage line has a second width directed in the first direction, wherein the second width decreases consistently as the first initialization voltage line extends from the first initialization voltage driver toward the circuit driver.

3. The display device of claim 2, wherein the second width of the first initialization voltage line increases consistently as the first initialization voltage line extends from the circuit driver toward the first initialization voltage driver.

4. The display device of claim 2, wherein, when the display device is viewed in a direction perpendicular to the substrate, a sum of the first width of the first signal line and the second width of the first initialization voltage line is constant at any point of the substrate in the second direction.

5. The display device of claim 2, further comprising a wiring portion comprising the first signal line and the first initialization voltage line.

6. The display device of claim 5, wherein a plurality of the wiring portion are arranged apart from each other at regular intervals in the first direction.

7. The display device of claim 2, further comprising:
a first organic light-emitting diode disposed above the circuit driver; and
a first subpixel circuit electrically connected to the first organic light-emitting diode and arranged adjacent to the circuit driver in the display area.

8. The display device of claim 7, wherein the first subpixel circuit comprises a first semiconductor layer and a first thin-film transistor insulated from the first semiconductor layer.

9. The display device of claim 7, wherein the first organic light-emitting diode comprises:
a subpixel electrode disposed on the substrate;
an emission layer disposed on the subpixel electrode; and
a counter electrode disposed on the emission layer.

10. The display device of claim 7, wherein the first subpixel circuit is electrically connected to the first signal line.

11. The display device of claim 7, wherein the first subpixel circuit is electrically connected to the first initialization voltage line.

12. The display device of claim 1, wherein the first width of the first signal line increases consistently as the first signal line extends from the peripheral area toward the circuit driver.

13. The display device of claim 1, further comprising a second signal line connected to the circuit driver and extending on the other side of the display area in the second direction, wherein the second signal line has a third width directed in the first direction, wherein the third width decreases consistently as the second signal line extends from the circuit driver toward the peripheral area.

14. The display device of claim 13, further comprising:

a second initialization voltage driver arranged on the other side of the peripheral area and extending in the first direction; and a second initialization voltage line connected to the second initialization voltage driver and extending in the second direction, wherein the second initialization voltage line has a fourth width directed in the first direction, wherein the fourth width decreases consistently as the second initialization voltage line extends from the second initialization voltage driver toward the circuit driver.

15. The display device of claim 14, wherein the fourth width of the second initialization voltage line increases consistently as the second initialization voltage line extends from the circuit driver toward the second initialization voltage driver.

16. The display device of claim 14, wherein, when the display device is viewed in a direction perpendicular to the substrate, a sum of the third width of the second signal line and the fourth width of the second initialization voltage line is constant at any point of the substrate in the second direction.

17. The display device of claim 13, wherein the third width of the second signal line increases consistently as the second signal line extends from the peripheral area toward the circuit driver.

18. A display device comprising:

a substrate comprising a display area and a peripheral area outside the display area;

a circuit driver arranged in a central portion of the display area and extending in a first direction;

a first initialization voltage driver arranged in the peripheral area and extending in the first direction;

a first signal line connected to the circuit driver, extending in a second direction crossing the first direction, and having a first width directed in the first direction; and a first initialization voltage line connected to the first initialization voltage driver, extending in the second direction, and having a second width directed in the first direction, wherein, when the display device is viewed in a direction perpendicular to the substrate, a sum of the first width and the second width is constant at any point of the substrate in the second direction.

19. The display device of claim 18, wherein the first width of the first signal line decreases consistently as the first signal line extends from the circuit driver toward the peripheral area.

20. The display device of claim 18, wherein the second width of the first initialization voltage line decreases consistently as the first initialization voltage line extends from the first initialization voltage driver toward the circuit driver.

* * * * *